(12) United States Patent
Azuma et al.

(10) Patent No.: US 6,507,089 B1
(45) Date of Patent: Jan. 14, 2003

(54) SEMICONDUCTOR DEVICE, SEMICONDUCTOR INTEGRATED CIRCUIT, AND METHOD FOR MANUFACTURING SEMICONDUCTOR DEVICE

(75) Inventors: Kouji Azuma, Tokyo (JP); Nobuyuki Hayama, Tokyo (JP); Norio Goto, Tokyo (JP)

(73) Assignee: NEC Corporation, Tokyo (JP)

( * ) Notice: Subject to any disclaimer, the term of this patent is extended or adjusted under 35 U.S.C. 154(b) by 26 days.

(21) Appl. No.: 09/589,681

(22) Filed: Jun. 7, 2000

(30) Foreign Application Priority Data

Jun. 16, 1999  (JP) ............................................ 11-169321

(51) Int. Cl.[7] ............................................ H01L 27/082
(52) U.S. Cl. ...................... 257/577; 257/197; 438/328; 438/312
(58) Field of Search ................................ 257/197, 577; 438/328, 312

(56) References Cited

U.S. PATENT DOCUMENTS 5,526,214 A * 6/1996 Takata et al. ............... 330/298
5,789,994 A * 8/1998 Case et al. .................. 327/181
6,154,082 A * 11/2000 Bernard et al. ............. 327/310

FOREIGN PATENT DOCUMENTS

| JP | 61-216477 | | 9/1986 | ............ H01L/29/78 |
| JP | 62-244172 | | 10/1987 | ............ H01L/29/72 |
| JP | 3-64929 A | * | 3/1991 | ......... H01L/21/331 |
| JP | 04-275070 | * | 9/1992 | ............ H02M/7/48 |

* cited by examiner

*Primary Examiner*—Eddie Lee
*Assistant Examiner*—Jose' R. Diaz
(74) *Attorney, Agent, or Firm*—Michael Best & Friedrich, LLC

(57) ABSTRACT

A semiconductor device is provided with a plurality of hetero junction bipolar transistors arranged in a specified direction. Also, the semiconductor device comprises emitter wiring connected to each emitter of the plural hetero junction bipolar transistors, collector wiring connected to each collector of said plural hetero junction bipolar transistors, and base wiring connected to at least one base of said plural hetero junction bipolar transistors. Bases that are not connected to the base wiring among the bases of the plural hetero junction bipolar transistors are connected to the emitter wiring.

3 Claims, 12 Drawing Sheets

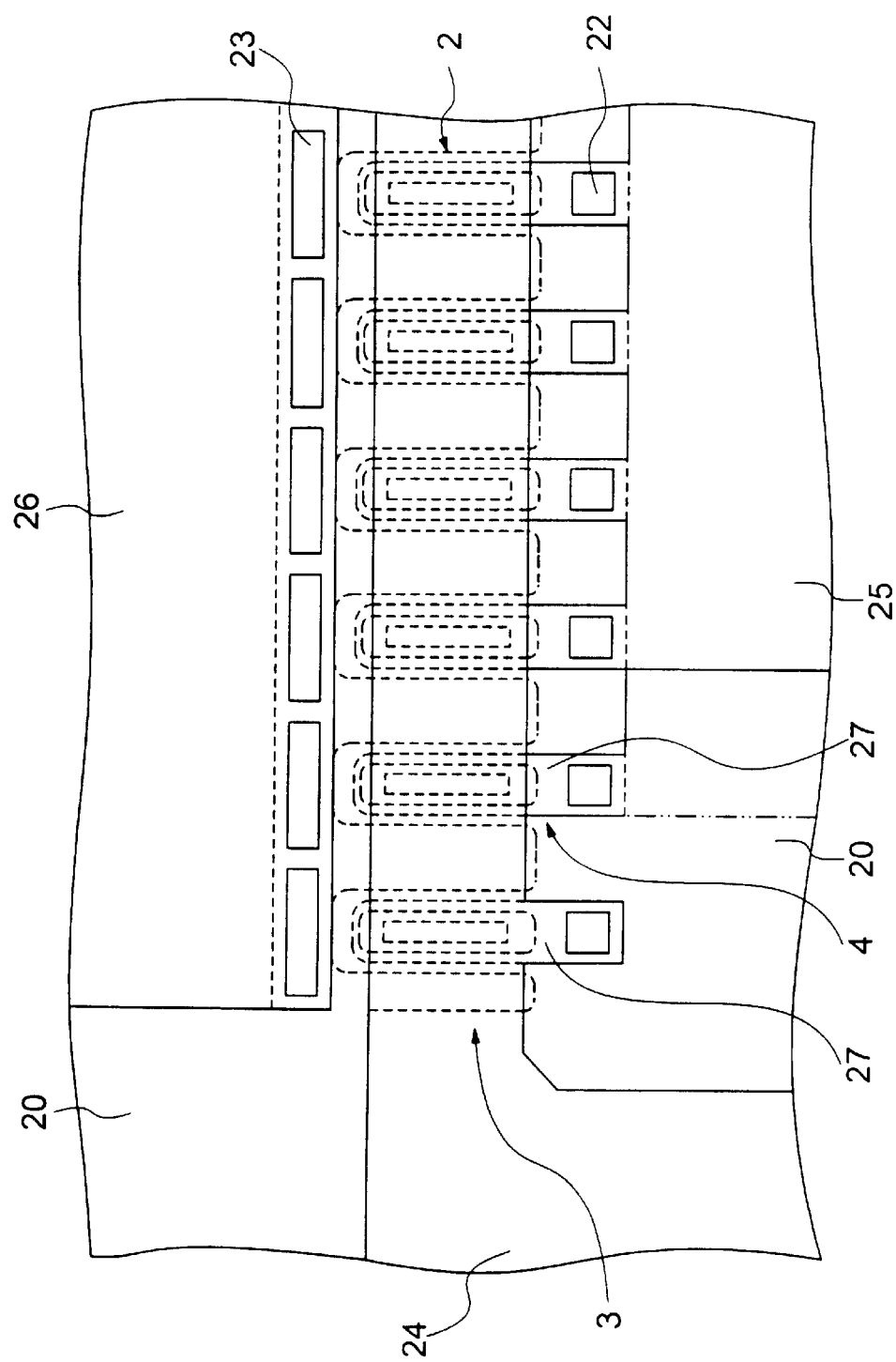

SEMICONDUCTOR DEVICE, SEMICONDUCTOR INTEGRATED CIRCUIT, AND METHOD FOR MANUFACTURING SEMICONDUCTOR DEVICE

BACKGROUND OF THE INVENTION

1. Field of the Invention

The present invention relates to a semiconductor device and a semiconductor integrated circuit in each of which at least one hetero junction bipolar transistor is formed, and a method for manufacturing such a semiconductor device, and in particular to a semiconductor device, a semiconductor integrated circuit, and a method for manufacturing such a semiconductor device, which are aimed at preventing the trouble of a hetero junction bipolar transistor caused by a surge.

2. Description of the Related Art

A multi-finger type hetero junction bipolar transistor (hereinafter the hetero junction bipolar transistor is referred to as an HBT) has been used for the transmission of portable devices. The multi-finger type HBT is provided with numerous emitter electrodes disposed in parallel with one another, and is made capable of a high power operation by connecting in common these emitter electrodes to one emitter pad. In the case where numerous emitter electrodes are thus provided, junction resistance, wiring resistance, parasitic capacitance, and the like are large, so that the level of electrostatic withstand voltage (surge withstand voltage) does not constitute a matter of concern for using the multi-finger type HBT.

However, when emitter fingers are used for applications such as a low-noise amplifier for reception, a driver, a mixer, or a transmitter, there are fewer emitter fingers, for example, only two or three.

FIG. 1 is a schematic plan view showing the construction of a semiconductor device having the conventional HBT. In the conventional HBT, a collector layer, an emitter layer, and a base layer are epitaxially grown one after another on a semi-insulating substrate.

A plurality of base electrodes is connected to the base layer, and the base electrodes are connected to base wiring 101b via base through holes 101c. A base pad 110a is provided on the base wiring 101b. Similarly, collector electrodes are connected to the collector layer, and the collector electrodes are connected to collector wiring 102b via collector through holes 102c. A collector pad 102a is provided on the collector wiring 102b. Emitter electrodes are formed to the emitter layer, and the emitter electrodes are connected to emitter wiring 103b via emitter through holes. Emitter pads 103a are provided on both ends of the emitter wiring 103b.

FIG. 2 is an equivalent circuit showing the construction of a semiconductor device having the conventional HBT. FIG. 2 corresponds to the semiconductor device shown in FIG. 1, apart from the number of transistors. The semiconductor device having the construction as shown in FIG. 1 is equivalent to the circuit having a plurality of HBTs in which, as shown in FIG. 2, each base is connected to a base electrode 111, in which each collector is connected in common to a collector electrode 112, and in which each emitter is connected to an emitter electrode 113.

However, when the number of emitter fingers of an HBT is reduced as described above, junction resistance, wiring resistance, and parasitic capacitance decreases, and thereby a gain is improved, but electrostatic withstand voltage decreases. As a result, the effects of junction capacitance and wiring resistance and the like become less, and consequently the HBT becomes relatively prone to suffer the effect of static electricity. That is, this raises the problem of dropping electrostatic withstand voltage drops, and thereby causing the HBT to be susceptible to a failure. FIG. 3 is a graphical representation showing an emitter current and an interterminal voltage at that time. Here, the solid line and the two-dot chain line show the emitter current and the interterminal voltage, respectively. FIG. 4 is a diagram showing a circuit used for evaluating the electrostatic withstand voltage.

In measuring the emitter current and the interterminal voltage, there was provided a capacitor 122 of which both electrodes were connected to the collector and the emitter of an HBT 121, respectively, and a power source 123 for charging the capacitor 122 was connected so that the emitter side has a positive potential. A switch 124 for switching between charge and discharge is installed at connection points of the collector and capacitor of the HBT 121, and the negative potential of a power source 123. In the circuit having such a construction, if the capacitor is charged with 20 V voltage and thereafter discharged, an emitter current of about 280 mA instantaneously (in the period of the order of nanoseconds) flows through the HBT 121. Once such a surge arises, in the conventional semiconductor device, the current flows as it is through the HBT, causing the HBT to fail.

The drawback of being low in electrostatic withstand voltage is also found in silicon base bipolar transistors. In order to solve this problem, a proposal has been made of a semiconductor device in which a Zener diode is connected between a collector and a base (Japanese Patent Laid-Open Publication No. Sho 62-244172). Even though such a construction is applied to an HBT, however, it cannot produce a sufficient effect on an HBT of which withstand voltage is low when a positive voltage is applied to its emitter and a negative voltage is applied to its collector.

Another proposal has been made of the semiconductor device using a field-effect transistor of which gate electrode is grounded and which is connected to an output terminal, as a transistor for protecting a surge (Japanese Patent Laid-Open Publication No. Sho 61-216477).

FIG. 5 is a circuit diagram showing the construction of the semiconductor device disclosed in Japanese Patent Laid-Open Publication No. Sho 61-216477. The semiconductor device disclosed in this publication has field-effect transistors 132a and 132b of which gates are connected to input terminals 131a and 131b, respectively. The connection points of the transistors 132a and 132b are connected to an output terminal 134. Also, there is provided a field-effect transistor 133 of which drain is connected between the connection point of the transistors 132a and 132b and the output terminal 134. The gate and the source of the transistor 133 are grounded.

In accordance with this semiconductor device, the intended purpose has been achieved by dispersing a surge voltage by means of the transistor 133. However, the adding of the transistor for protecting surge may deteriorate the performance (gain) of the semiconductor device. The transistor for protecting surge, therefore, cannot be applied to an HBT as it is.

SUMMARY OF THE INVENTION

Accordingly, it is an object of the present invention to provide a semiconductor device and a semiconductor integrated circuit, capable of preventing the failure of a hetero junction bipolar transistor caused by a surge, and to provide a method for manufacturing such a semiconductor device.

According to one aspect of the present invention, a semiconductor device comprises a hetero junction bipolar transistor, and a diode connected between a collector and an emitter of the hetero junction bipolar transistor.

The above-mentioned diode may be a hetero junction bipolar transistor whose base and emitter are short-circuited.

Another aspect of the present invention, a semiconductor device comprises a plurality of hetero junction bipolar transistors arranged in a first direction, emitter wiring connected to each emitter of the plural hetero junction bipolar transistors, collector wiring connected to each collector of the plural hetero junction bipolar transistors, and base wiring connected to at least one base of the plural hetero junction bipolar transistors. Bases that are not connected to the base wiring among the bases of the plural hetero junction bipolar transistors are connected to the emitter wiring.

Each of the above-described plurality of hetero junction bipolar transistors may have a base electrode and a collector electrode each of which is arranged like teeth of a comb. The teeth of a comb extend in a second direction orthogonal to the first direction.

According to another aspect of the present invention, a semiconductor device comprises a plurality of hetero junction bipolar transistors arranged in a first direction, at least one diode disposed at predetermined positions between the plural hetero junction bipolar transistors, emitter wiring connected to each emitter of the plural hetero junction bipolar transistors and to an anode of the diode, collector wiring connected to each collector of the plural hetero junction bipolar transistors and to a cathode of the diode, and base wiring connected to each base of the plural hetero junction bipolar transistors.

In the present invention, even if, on occurrence of a surge, a large current tries to flow from the emitter of a hetero junction bipolar transistor to operate as a transistor toward the collector thereof, current generated by the surge hardly flows through the hetero junction bipolar transistor to operate as a transistor, since this current flows through the diode connected between the collector and the emitter of the transistor, or flows between the base and the collector of the hetero junction bipolar transistor whose base is connected to the emitter wiring. This prevents the failure of the hetero junction bipolar transistor to operate as a transistor.

According to another aspect of the present invention, a semiconductor integrated circuit comprises a first hetero junction bipolar transistor, and a second hetero junction bipolar transistor whose base and emitter are connected to an emitter of the first hetero junction bipolar transistor.

According to another aspect of the present invention, a manufacturing method for a semiconductor device comprises forming a first conductive type collector layer on a substrate, forming a plurality of hetero junction bipolar transistors by laminating a plurality of second conductive type base layers and a plurality of first conductive type emitter layers on the collector layer, and forming emitter wiring connected to each of the emitter layers and to a predetermined number of the base layers.

In the manufacturing method of the present invention, since a predetermined number of base layers are connected to the emitter wiring when forming the emitter wiring to be connected to each emitter layer, a hetero junction bipolar transistors whose base and emitter are short-circuited can be easily formed. Furthermore, only by changing the number of base layers connected to the emitter wiring in the above-described step, it is possible for the present method to be adapted to a plurality of types of semiconductor devices. This allows the cost reduction in the development and production of semiconductor device .

BRIEF DESCRIPTION OF THE DRAWINGS

The above and other objects, features and advantages of the present invention will be apparent from the following detailed description of the preferred embodiments of the invention in conjunction with the accompanying drawings, in which:

FIG. 6A is a schematic plan view, and FIG. 6B is an equivalent circuit diagram;

FIG. 9A is a schematic plan view, and FIG. 9B is an equivalent circuit diagram;

FIG. 10 is a schematic plan view showing the construction of the semiconductor device in accordance with a third embodiment of the present invention;

DETAILED DESCRIPTION OF THE PREFERRED EMBODIMENTS

Figure 6A:
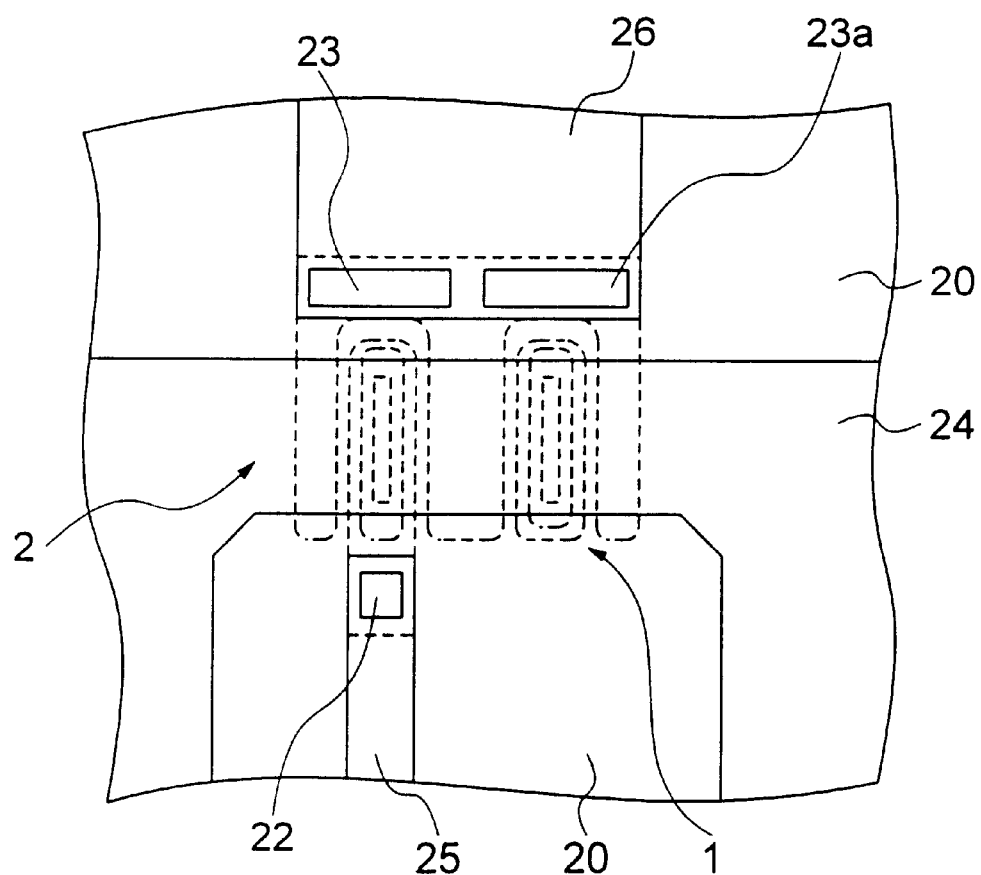
FIGS. 6A or 6B are representations showing the construction of the semiconductor device in accordance with a first embodiment of the present invention.
Figure 6B:
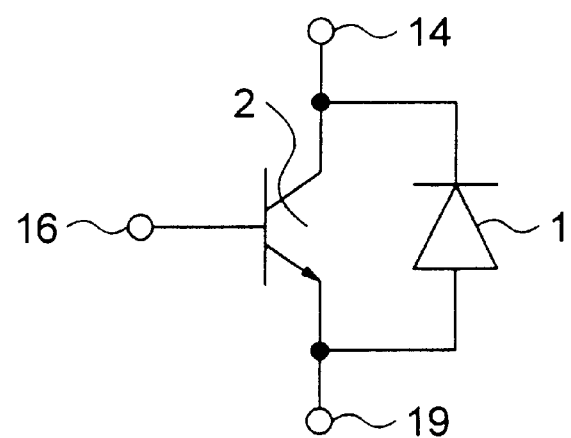
Figure 7:
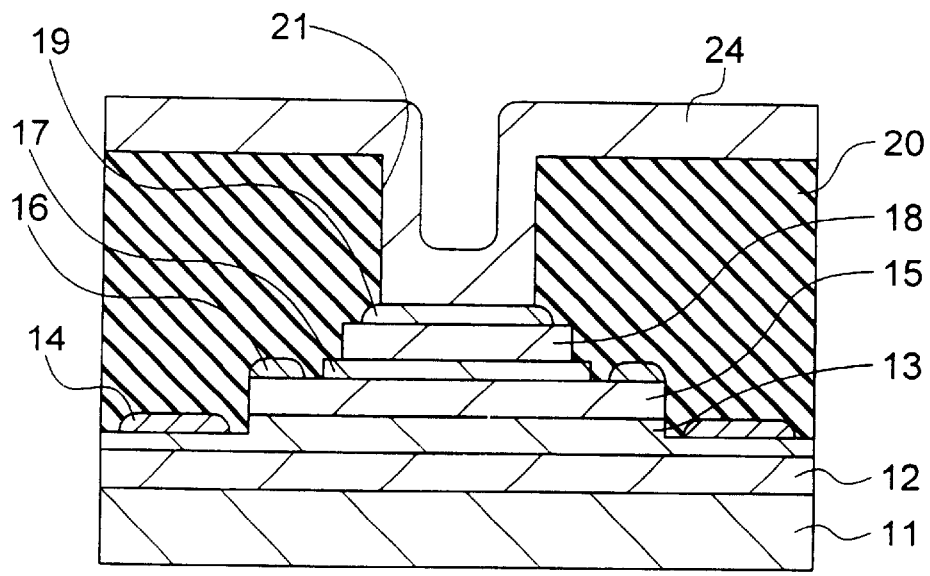
FIG. 7 is a cross-sectional view showing the construction of an HBT in the first embodiment of the present invention.
Figure 8:
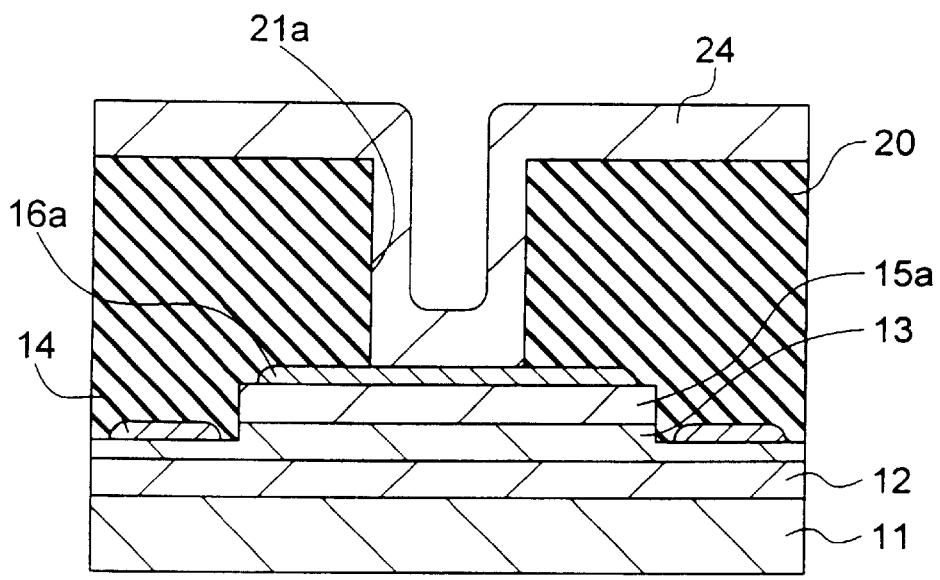
FIG. 8 is a cross-sectional view showing the construction of a diode in the first embodiment of the present invention.

Hereinafter, the semiconductor device in accordance with the embodiments of the present invention will be described with reference to the accompanying drawings. FIGS. 6A and 6B illustrate the construction of the semiconductor device in accordance with a first embodiment of the present invention, in which FIG. 6A is a schematic plan view, and FIG. 6B is an equivalent circuit diagram. FIG. 7 shows the construction of an HBT in the first embodiment of the present invention in the form of cross-sectional view, and FIG. 8 illustrates the construction of a diode in the first embodiment of the present invention in the form of cross-sectional view.

As shown in FIGS. 6A and 6B, in the first embodiment, there is provided a diode 1 and a hetero junction bipolar transistor (HBT) 2. An anode of the diode 1 is connected to an emitter electrode 19 of the HBT 2, and a cathode of the diode 1 is connected to a collector electrode 14 of the HBT 2.

As shown in FIG. 7, in the area where the HBT 2 is provided, a buffer layer 12 is formed on a semi-insulting substrate 11. An N-type collector layer 13 is formed on the buffer layer 12. On the collector layer 13, a collector electrode 14 is selectively formed. On the area of the collector layer 13 where the collector electrode 14 is not provided, a P-type base layer 15 is formed. On the base layer 15, a base electrode 16 is selectively formed. Furthermore, on the area of the base layer 15 where the base electrode 16 is not formed, an N-type emitter layer 17, an emitter contact layer 18, and an emitter electrode 19 are laminated on top of each other in this order.

An interlayer insulating film is formed over the whole surface as a protective film 20. In the protective film 20, there are provided an emitter through hole 21, a base through hole 22, and a collector through hole 23, and these extend to the emitter electrode 19, the base electrodes 16, and the collector electrodes 14, respectively.

Also, on the protective film 20, there is formed an emitter wiring 24 connected to the emitter electrode 19 via an emitter through hole 21. Similarly, on the protective film 20, there are formed base wiring 25 connected to the base electrode 16 via the base through hole 22, and collector wiring 26 connected to the collector electrode 14 via the collector through hole 23.

Emitter pads (not shown) are provided on both ends of the emitter wiring 24, a base pad (not shown) is provided on the base wiring 25, and a collector pad (not shown) is provided on the collector wiring 26.

On the other hand, in the area where the diode 1 is formed, there are formed the buffer layer 12, the N-type collector layer 13, the collector electrodes 14, and a P-type base layer 15a on the semi-insulting substrate 11, similarly to the case of the area where the HBT 2 is formed. An emitter/base electrode 16a is formed on the base layer 15a.

An interlayer insulating film is formed over the whole surface as a protective film. In the protective film 20, there are provided an emitter/base through hole 21a, and a collector through hole 23a, and these extend to the emitter/base electrode 16a and collector electrodes 14, respectively.

The emitter wiring 24 is connected to the emitter/base electrode 16a via the emitter/base through hole 21a. That is, the emitter/base electrode 16a is connected to the emitter electrode 19 of the HBT 2. Also, the collector wiring 26 is connected to the collector electrode 14 via the collector through hole 23a.

In this area, the N-type collector layer 13 corresponds to the cathode of the diode 1, and the P-type base layer 15a corresponds to the anode of the diode 1.

The collector electrodes 14, the base electrodes 16, and the emitter/base electrode 16a are formed into the shape of the teeth of a comb and extend in the parallel direction with one another. For example, the size of the base layers 15 and 15a in the direction of the length are about 20 $\mu$m, and their size in the direction orthogonal to the direction of the length is about 3 $\mu$m.

Figure 1:
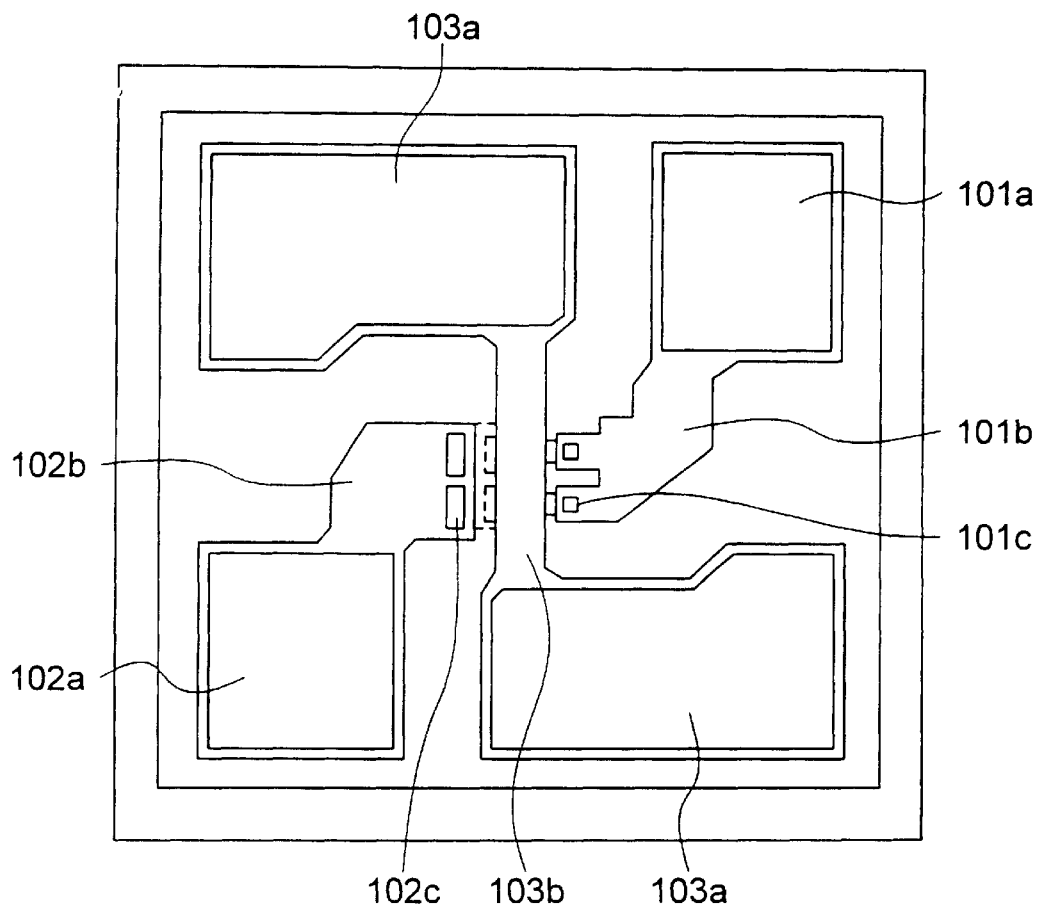
FIG. 1 is a schematic plan view showing the construction of a semiconductor device having a conventional HBT.
Figure 2:
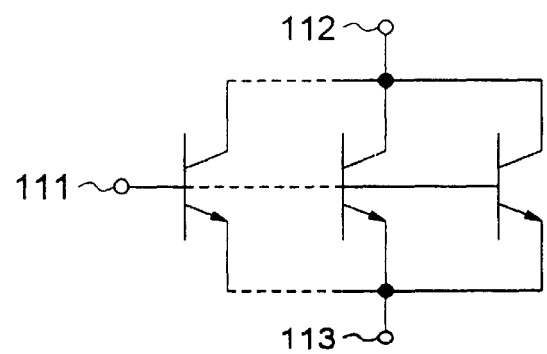
FIG. 2 is an equivalent circuit showing the construction of a semiconductor device having the conventional HBT.
Figure 3:
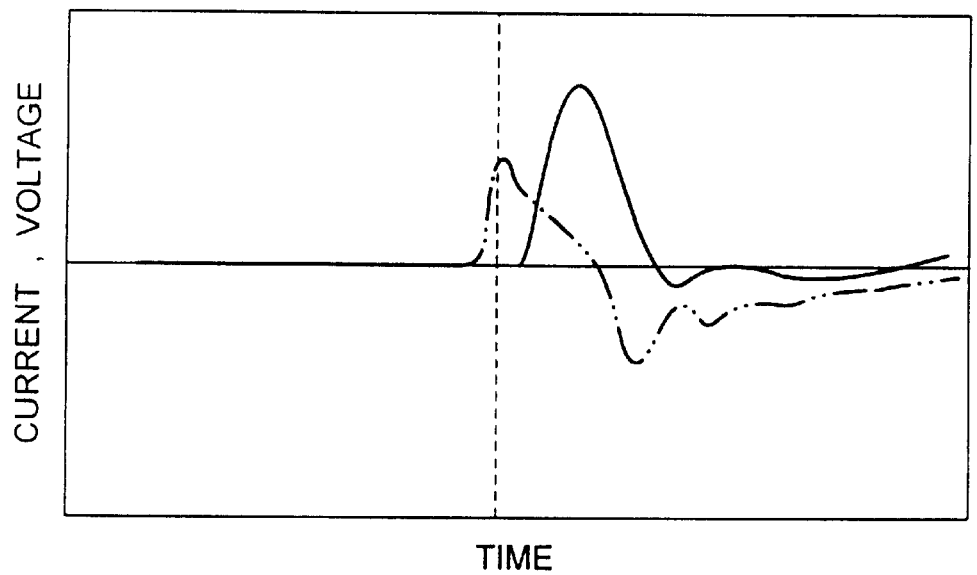
FIG. 3 is a graphical representation showing an emitter current and an inter-terminal voltage in the case where there is provided one HBT.
Figure 4:
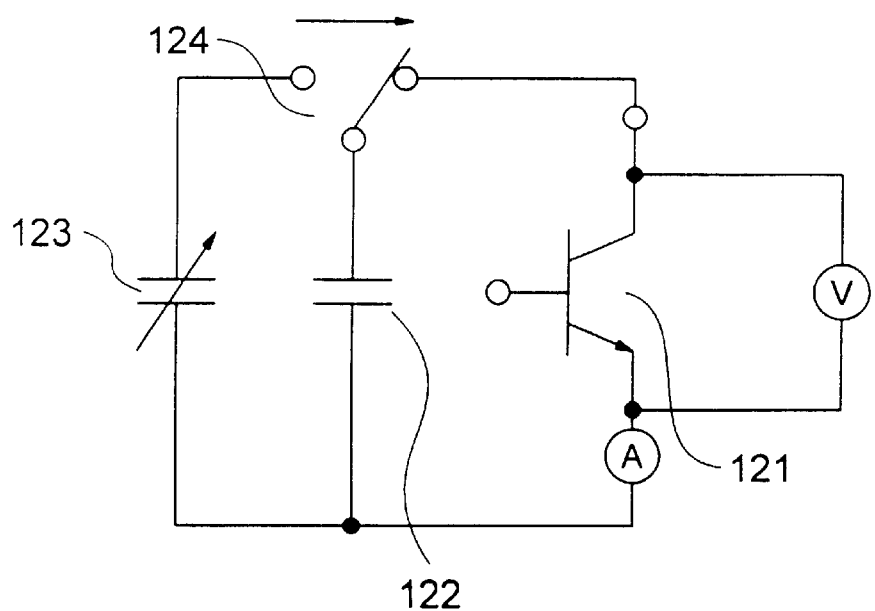
FIG. 4 is a diagram showing a circuit used for evaluating the electrostatic withst and voltage of HBT.
Figure 5:
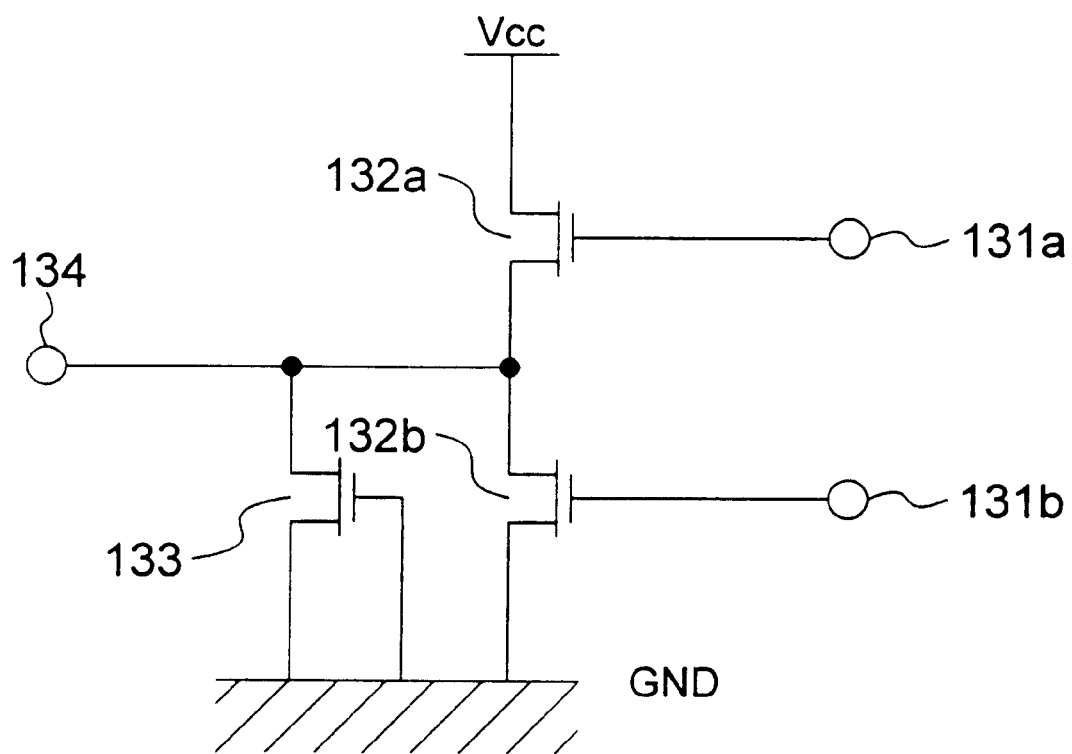
FIG. 5 is a circuit diagram showing the construction of the semiconductor device disclosed in Japanese Patent Laid-open Publication No. Sho 61-216477.

In the first embodiment having such a construction, if a surge voltage is generated, and a positive potential is applied to the emitter and a negative potential is applied to the collector, then most of the current generated by the surge flows through the diode 1, and hardly flows through the HBT 2. For example, when a surge is caused to arise by using the circuit shown in FIG. 4, the value of current flowing through the HBT 2 is about 2 to 3 mA. This results in the prevention of the failure of the HBT 2 caused by a surge voltage. Also, in a typical bias state, that is, in the state where a positive potential relative to the potential of the emitter is applied to the collector, no current flows through the diode, thereby a normal operation of the HBT being secured.

It should be noted that a size of a diode is not particularly limited. When a higher electrostatic withstand voltage is required, a large sized one may be used, and when a high-speed operation is required, a small sized one may be used within the limits where a desired electrostatic withstand voltage can be obtained.

Figure 9A:
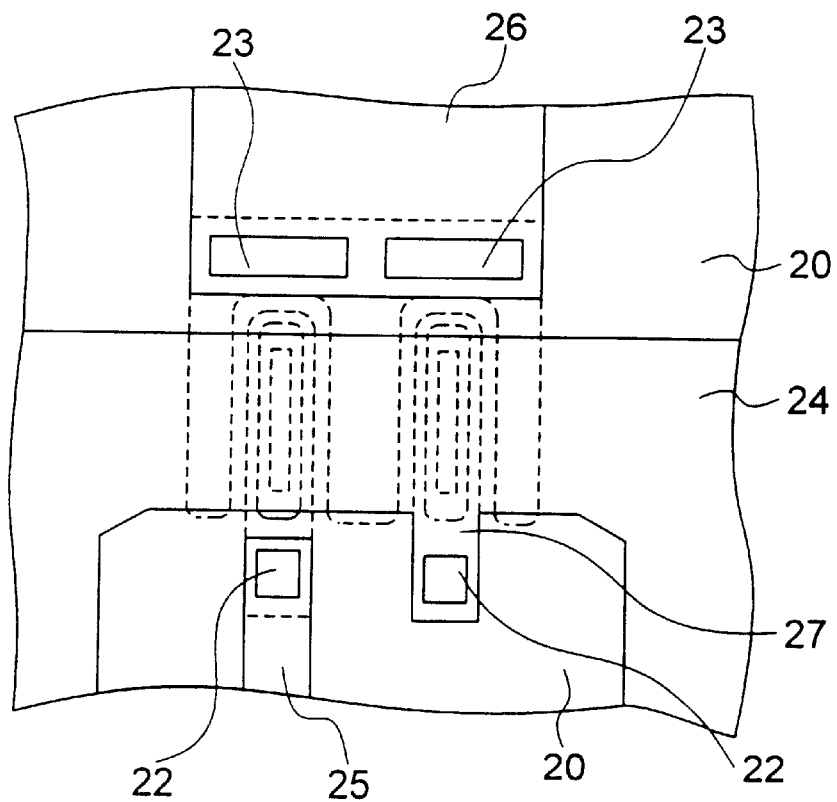
FIGS. 9A and 9B are representations showing the construction of the semiconductor device in accordance with a second embodiment of the present invention.
Figure 9B:
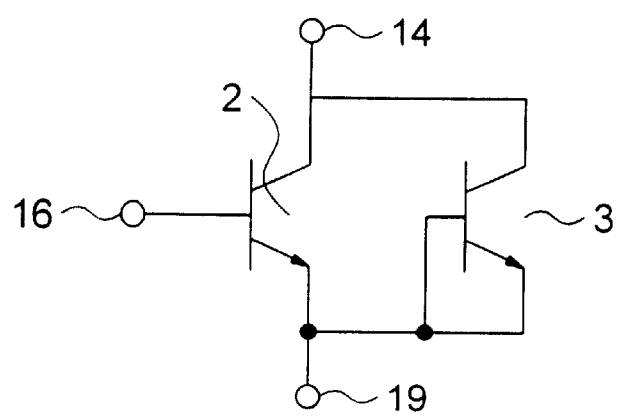

Next, the second embodiment of the present invention will be described. In the second embodiment, as a diode, an HBT whose base and emitter are short-circuited is provided. FIGS. 9A and 9B illustrate the construction of the semiconductor device in accordance with the second embodiment of the present invention, in which FIG. 9A is a schematic plan view, and FIG. 9B is an equivalent circuit diagram. Here, in the second embodiment shown in FIGS. 9A and 9B, the same components as those of the first embodiment shown in FIGS. 6A and 6B are identified by the same reference character, and detailed description thereof is omitted.

In the second embodiment, there is provided an HBT 3 whose base and emitter are short-circuited, in place of the diode 1 in the first embodiment. The collector of the HBT 3 is connected to the collector electrodes 14 of the HBT 2, and the base and the emitter of the HBT 3 are connected to the emitter electrode 19 of the HBT 2.

The construction of the HBT 3 itself is equivalent to that of the HBT 2. However, the HBT 3 is different from the HBT 2 in that a base/emitter short-circuit wiring 27 which connects the base through hole 22 and the emitter wiring 24 in the HBT 3 is formed on the protective layer 20, and that the base electrodes in the HBT 3 is connected not to the base wiring 25 but to the emitter wiring 24. The base/emitter short-circuit wiring 27 is, for example, Al wiring or Au wiring, and constitutes a portion of the emitter wiring 24.

In the second embodiment having such a construction, if a surge voltage is generated, and a positive potential is applied to the emitter and a negative potential is applied to the collector, then most of the current generated by the surge flows through the path from the base to the collector of the HBT 3, and hardly flows through the HBT 2. This results in the prevention of the failure of the HBT 2 caused by a surge voltage.

Figure 11:
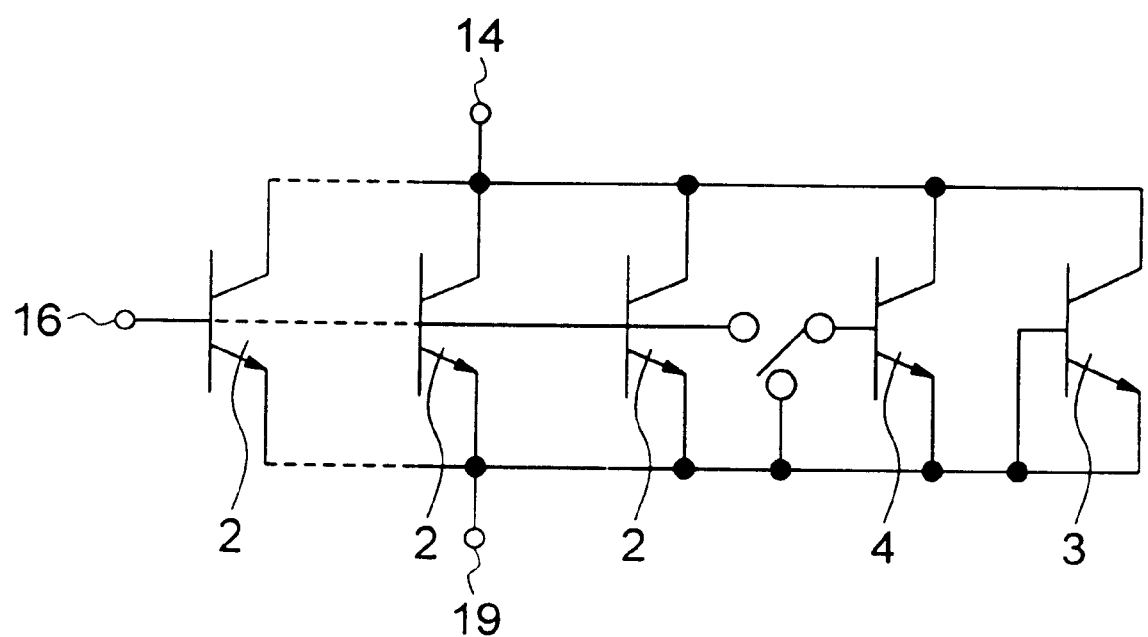
FIG. 11 is an equivalent circuit diagram showing the construction of the semiconductor device in accordance with the third embodiment of the present invention.

Next, the third embodiment of the present invention will be described. In the third embodiment, the number of the HBTs to operate as transistors is made variable in the manufacturing process therefor. FIG. 10 shows the construction of the semiconductor device in accordance with the third embodiment of the present invention. FIG. 11 is an equivalent circuit diagram representing the construction of the semiconductor device in accordance with the third embodiment of the present invention. Here, in the third embodiment shown in FIGS. 10 and 11, the same components as those of the second embodiment shown in FIGS. 9A and 9B are identified by the same reference character, and detailed description thereof is omitted.

In the third embodiment, there are provided a plurality of HBTs 2. The bases, collectors, and emitters thereof are each connected in common. As in the case of the second embodiment, there is provided an HBT 3 connected to the HBTs 2. Also, an HBT 4 is provided between one of the HBTs 2 and the HBT 3. The emitter of the HBT 4 is connected to the emitter electrode 19 of the HBT 2, and the collector of the HBT 4 is connected to the collector electrode 14 of the HBT 2.

As shown in FIG. 10, in the third embodiment manufactured, although the base electrode of the HBT 4 is connected to the emitter wiring 24 via the base/emitter short-circuit wiring 27 as in the case of the HBT 3, the base electrode of the HBT 4 may be connected to the base wiring 25 in the manufacturing process as in the case of the HBT 2. In this case, in FIG. 10, the base/emitter short-circuit wiring 27 is not provided, and the base wiring 25 has a form such as to extend to the area shown by a two-dot chain line.

When manufacturing such a semiconductor device of the third embodiment, after forming a collector layer on the substrate, base layers and emitter layers more than the minimum number thereof required to operate as a transistor, are previously formed like the teeth of a comb on the collector layers. Next, in the wiring forming process where the base wiring, emitter wiring, collector wiring, and the like are formed, the wiring may be formed by selecting, from the base wiring and the emitter wiring, the connection destination to which the base through hole is to be connected. Therefore, even if the process before the wiring forming process is the same, this third embodiment can be adapted to a plurality of types of semiconductor devices by slightly changing the process thereafter. That is, this third embodiment has a high degree of flexibility in the number of the HBTs whose base and emitter are short-circuited, thereby allowing the cost reduction in the development and production thereof.

Figure 12:
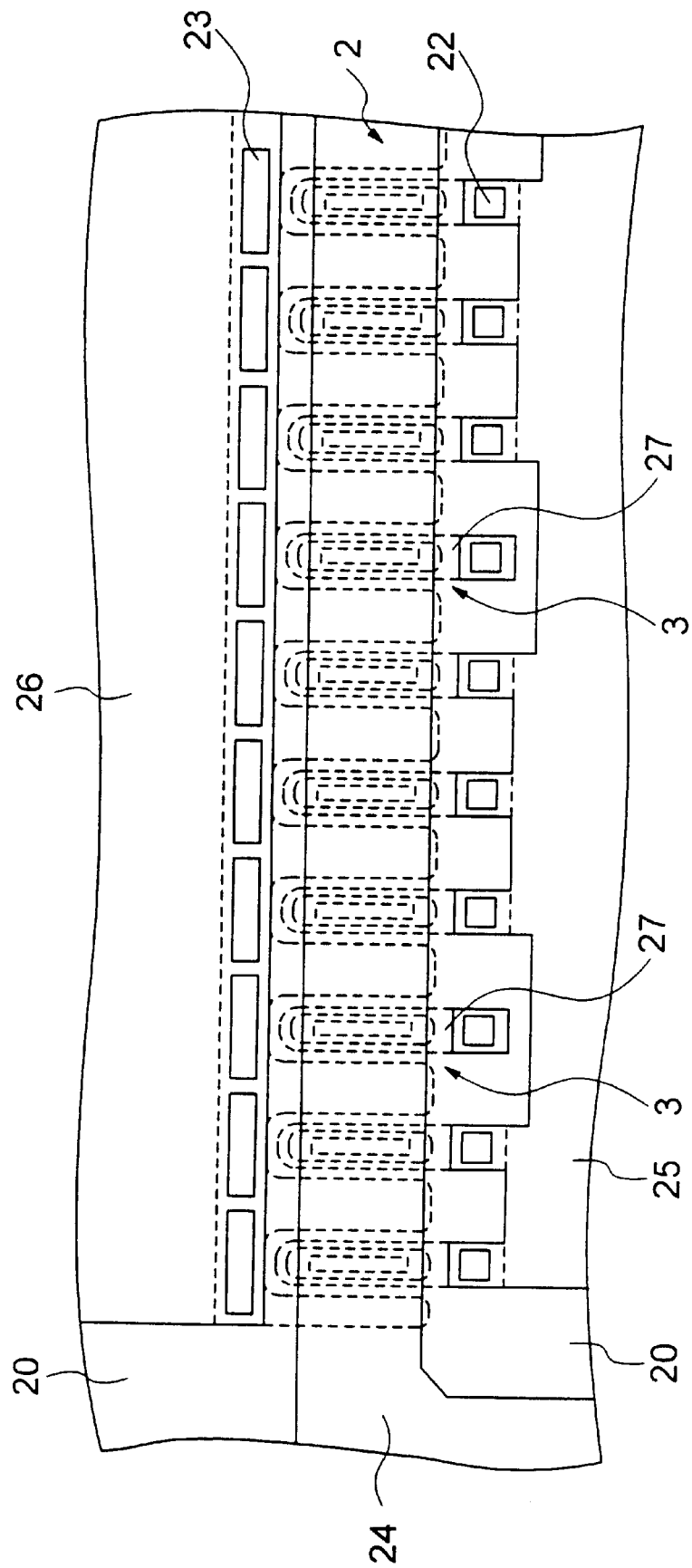
FIG. 12 is a schematic plan view showing the construction of the semiconductor device in accordance with a fourth embodiment of the present invention.
Figure 13:
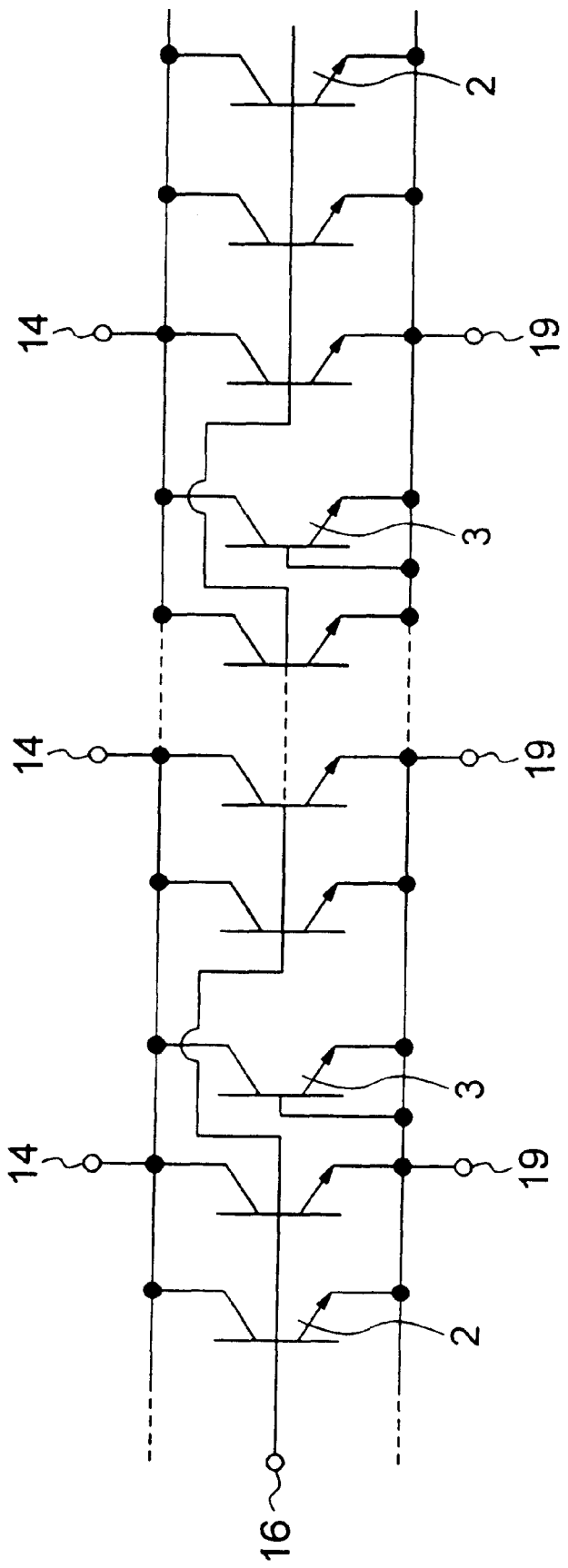
FIG. 13 is an equivalent circuit diagram showing the construction of the semiconductor device in accordance with the fourth embodiment of the present invention.

Next, the fourth embodiment of the present invention will be described. While in the third embodiment the HBT of which base and emitter are short-circuited is disposed at one end of a group arranged like the teeth of a comb, in the fourth embodiment the HBT of which base and emitter are short-circuited are disposed at arbitrary positions within the group. FIG. 12 shows the construction of a semiconductor device in accordance with a fourth embodiment of the present invention, and FIG. 13 is an equivalent circuit diagram showing the construction of a semiconductor device in accordance with a fourth embodiment of the present invention. Here, in the fourth embodiment shown in FIGS. 12 and 13, the same components as those of the third embodiment shown in FIGS. 10 and 11 are identified by the same reference character, and detailed description thereof is omitted.

In the fourth embodiment, base/emitter short-circuit wiring 27 is provided at HBTs situated at, for example, third, seventh, . . . positions from one end of the group comprising a plurality of HBTS. That is, a base electrode is connected to an emitter wiring 24 for each four HBTs, for example.

If HBTs whose base and emitter are connected are biased to one end of the group as in the case of the third embodiment, in an HBT at a sufficient distance therefrom a large current generated by a surge could not be completely suppressed. However, in the fourth embodiment, since a base and an emitter are connected for each four HBTs, there is no risk as mentioned above. This leads to the increase in the reliability.

Meanwhile, in the second to fourth embodiments, although the base electrode of an HBT of which base and emitter are connected is connected to the emitter wiring 24 via the base/emitter short-circuit wiring 27, the base electrode may be constructed so as to be directly connected to the emitter pad through the base through hole.

Figure 14:
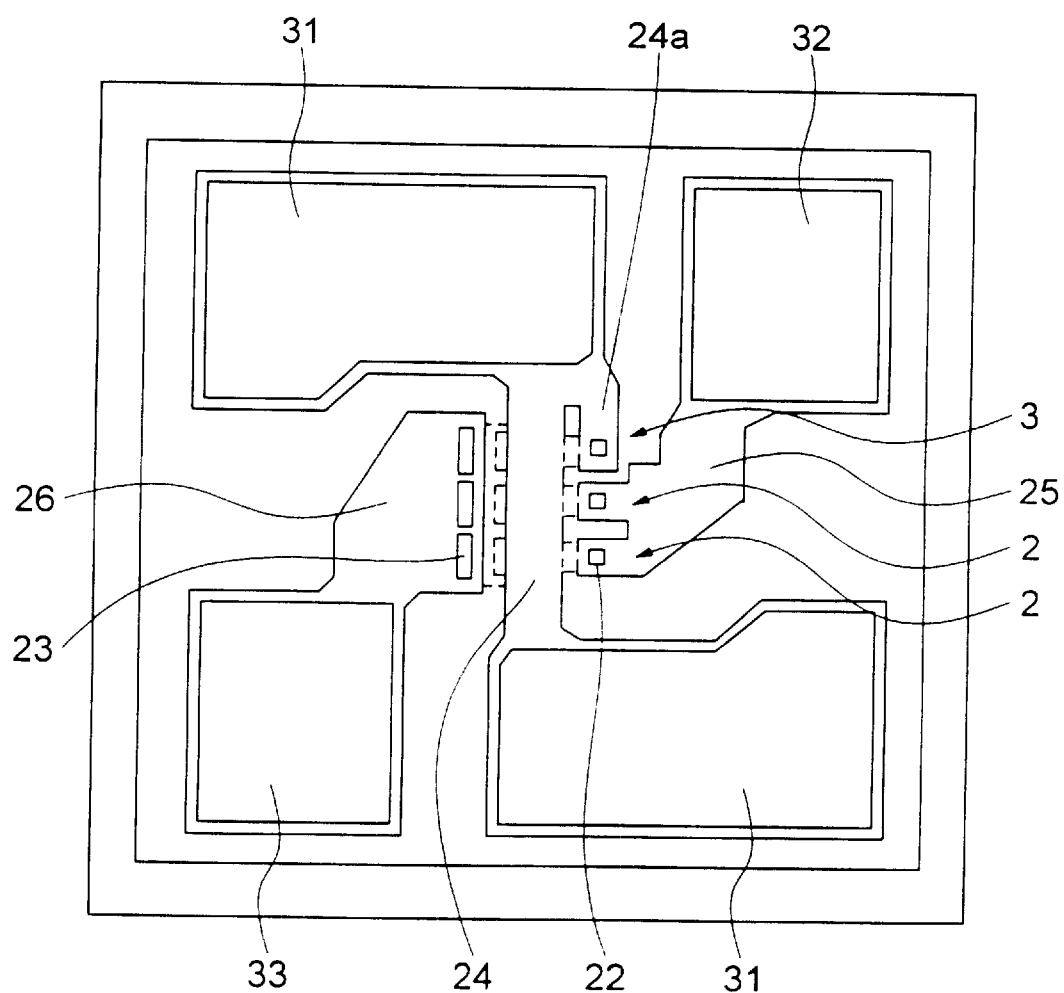
FIG. 14 is a schematic plan view showing the construction of the semiconductor device in accordance with a fifth embodiment of the present invention.

FIG. 14 shows the construction of the semiconductor device in accordance with the fifth embodiment of the present invention. Here, in the fifth embodiment shown in FIGS. 14, the same components as those of the second embodiment shown in FIGS. 9A and 9B are identified by the same reference character, and detailed description thereof is omitted.

In the fifth embodiment, there are provided emitter pads 31 on both ends of the emitter wiring 24, a base pad 32 on the base wiring 25, and a collector pad 33 on the collector wiring 26. The base electrodes of the HBTs 2 are, as in the case of the second embodiment, connected to the base pad 32 via a base through hole 22. On the other hand, the base electrodes of the HBT 3 is connected to the emitter pad 31 via base through holes 22 by the wiring 24a extending parallel with the emitter wiring 24.

Also in the fifth embodiment having such a construction, most of the current generated by the surge flows through the HBT 3, and hardly flow through the HBTs 2. This results in the prevention of the failure of the HBTs 2 caused by a surge voltage.

Figure 15:
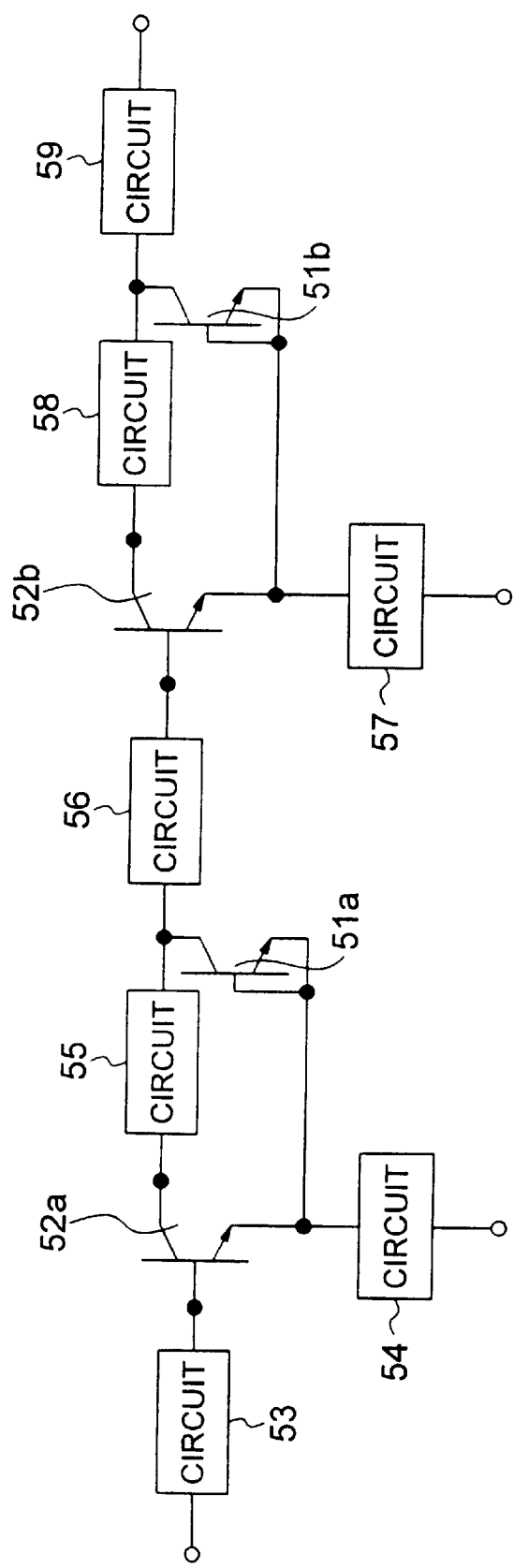
FIG. 15 is a block diagram showing an example of a semiconductor integrated circuit to which the present invention is applied.

The present invention is not limited to a combination of HBTs as in the case of each embodiment as described above, but can also be applied to an integrated circuit. FIG. 15 shows an example of an integrated circuit to which the present invention is applied.

For example, circuits 53, 54, and 55 are connected to a base, an emitter, and a collector of an HBT 52a, respectively. A circuit 56 is connected to the circuit 55. There is provided an HBT 52b whose base is connected to the circuit 56. Circuits 57 and 58 are connected to an emitter and a collector of the HBT 52b, respectively. To the circuit 58, a circuit 59 is also connected.

There is provided an HBT 51a whose base and emitter are connected to the emitter of the HBT 52a. A collector of the HBT 51a is connected between the circuits 55 and 56. Also, there is provided an HBT 51b whose base and emitter are connected to the emitter of the HBT 52b. A collector of the HBT 51b is connected between the circuits 58 and 59.

In the semiconductor integrated circuits having such a construction, even if there occurs a surge such that a large emitter current flows through the HBT 52a or 52b, most of such an emitter current flows through the HBT 51a or 51b. This leads to the prevention of the failure of the HBT 52a and 52b.

While there has been described what are at present considered to be preferred embodiments of the invention, it will be understood that various modifications may be made thereto, and it is intended that the appended claims cover all such modification as fall within the true spirit and scope of the invention.

What is claimed is:

1. A semiconductor device comprising:

a plurality of hetero junction bipolar transistors arranged in a first direction;

emitter wiring connected to each emitter of said plural hetero junction bipolar transistors;

collector wiring connected to each collector of said plural hetero junction bipolar transistors; and base wiring connected to at least one base of said plural hetero junction bipolar transistors, wherein bases which are not connected to said base wiring among the bases of said plural hetero junction bipolar transistors are connected to said emitter wiring.

2. The semiconductor device according to claim 1, wherein each of said plurality of hetero junction bipolar transistors has a base electrode and a collector electrode which are arranged like the teeth of a comb, said teeth of a comb extending in a second direction orthogonal to said first direction.

3. A semiconductor integrated circuit comprising:

a first hetero junction bipolar transistor; and a second hetero junction bipolar transistor whose base and emitter are connected to an emitter of said first hetero junction bipolar transistor.

* * * * *